United States Patent
Jung et al.

(10) Patent No.: US 7,602,650 B2
(45) Date of Patent: Oct. 13, 2009

(54) FLASH MEMORY DEVICE AND METHOD FOR PROGRAMMING MULTI-LEVEL CELLS IN THE SAME

(75) Inventors: Kee-Ho Jung, Suwon-si (KR); Jae-Yong Jeong, Yongin-si (KR); Chi-Weon Yoon, Seocho-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 85 days.

(21) Appl. No.: 11/847,388

(22) Filed: Aug. 30, 2007

(65) Prior Publication Data

US 2008/0055998 A1    Mar. 6, 2008

Related U.S. Application Data

(63) Continuation-in-part of application No. 11/642,925, filed on Dec. 21, 2006.

(30) Foreign Application Priority Data

Aug. 30, 2006  (KR) ............................... 2006-82982
Apr. 3, 2007   (KR) ..................... 10-2007-0032854

(51) Int. Cl.
  *G11C 11/34*   (2006.01)
(52) U.S. Cl. .............................. 365/185.22; 365/185.24
(58) Field of Classification Search ............ 365/185.22, 365/184.24, 201
See application file for complete search history.

(56) References Cited

U.S. PATENT DOCUMENTS

| 5,812,457 | A  | 9/1998  | Arase |
| 5,818,761 | A  | 10/1998 | Onakado et al. |
| 5,991,517 | A  | 11/1999 | Harari et al. |
| 6,366,496 | B1 | 4/2002  | Torelli et al. |
| 6,542,403 | B1 | 4/2003  | Parker |
| 6,542,407 | B1 | 4/2003  | Chen et al. |
| 6,937,524 | B2* | 8/2005 | Shiga et al. ............... 365/185.3 |
| 6,944,063 | B2 | 9/2005  | Chen et al. |
| 6,954,380 | B2 | 10/2005 | Ono et al. |
| 7,057,936 | B2* | 6/2006 | Yaegashi et al. ........ 365/185.22 |
| 7,073,103 | B2 | 7/2006  | Gongwer et al. |
| 7,102,924 | B2 | 9/2006  | Chen et al. |
| 7,224,614 | B1 | 5/2007  | Chan |
| 7,233,529 | B2 | 6/2007  | Matsubara et al. |
| 7,283,397 | B2 | 10/2007 | Harari et al. |

FOREIGN PATENT DOCUMENTS

| JP | 07-226097       | 8/1995 |
| JP | 2001-057091     | 2/2001 |
| JP | 2004-253089     | 9/2004 |
| KR | 1020010082518 A | 8/2001 |
| KR | 2004-253089     | 9/2004 |

* cited by examiner

*Primary Examiner*—Son Dinh
(74) *Attorney, Agent, or Firm*—Volentine & Whitt, PLLC

(57) ABSTRACT

In one aspect, a program method is provided for a flash memory device including a plurality of memory cells each being programmed in one of a plurality of data states. The program method of this aspect includes programming selected memory cells in a first data state, verifying a result of the programming, successively programming selected memory cells in at least two or more data states corresponding to threshold voltages which are lower than a threshold voltage corresponding to the first data state, and verifying results of the successive programming.

30 Claims, 20 Drawing Sheets

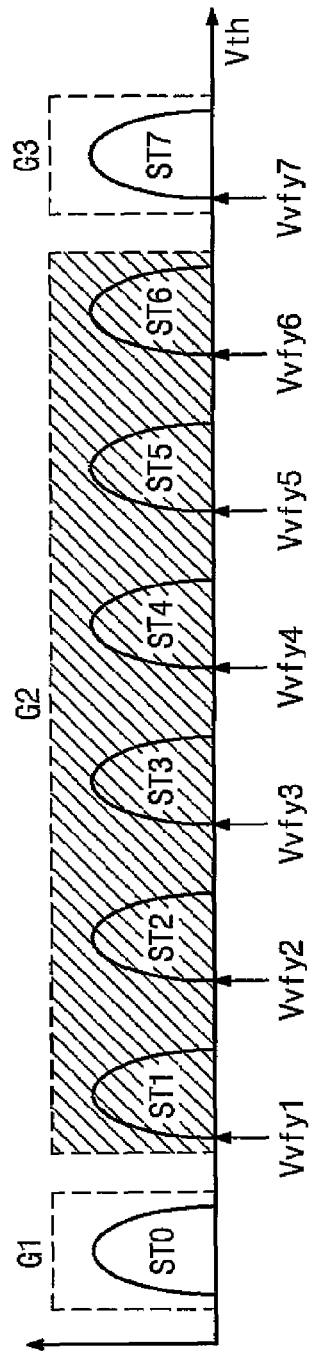
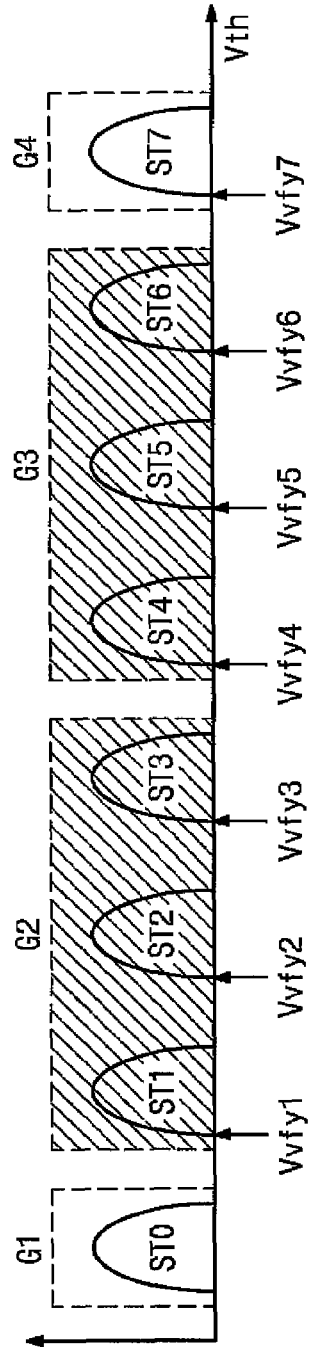
Fig. 9A
Fig. 9B

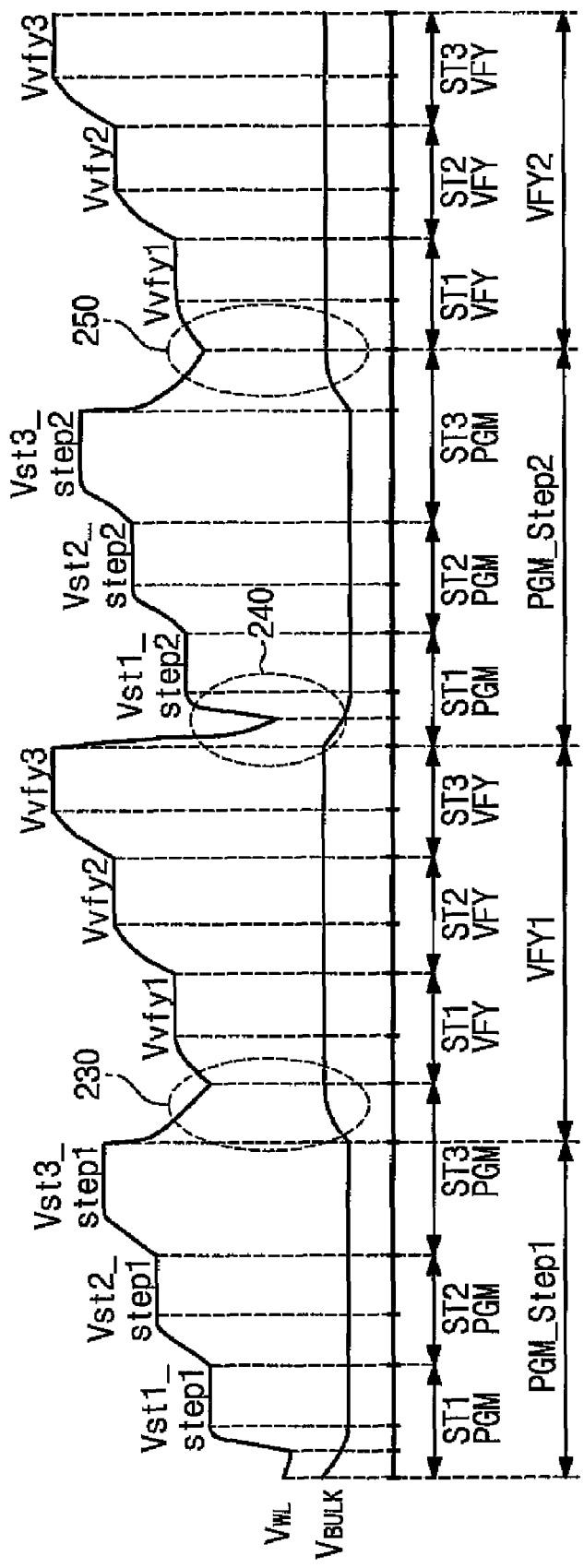

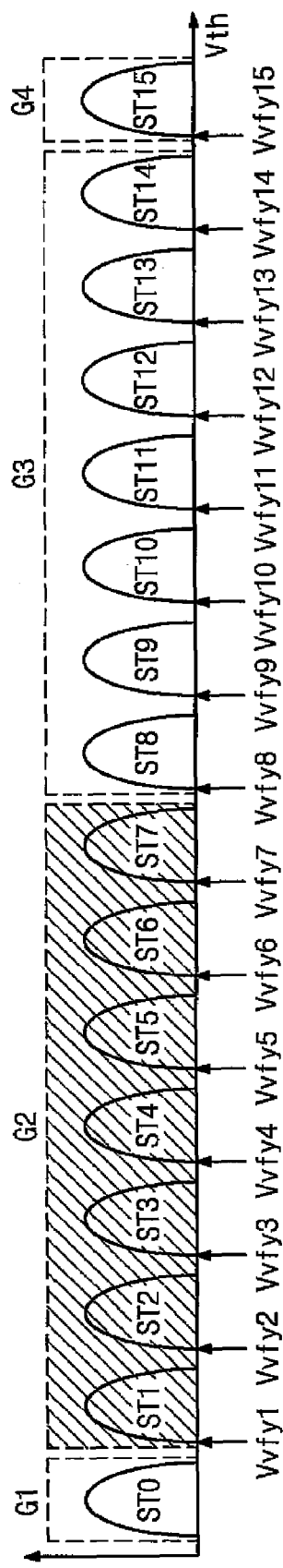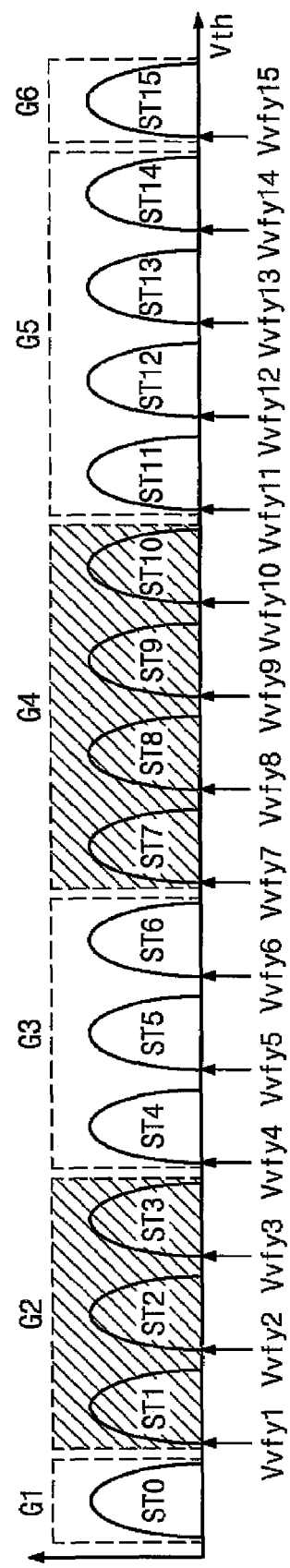

FLASH MEMORY DEVICE AND METHOD FOR PROGRAMMING MULTI-LEVEL CELLS IN THE SAME

CROSS-REFERENCE TO RELATED APPLICATIONS

This is a continuation-in-part (CIP) of U.S. non-provisional application Ser. No. 11/642,925, filed Dec. 21, 2006, the entire content of which is herein incorporated by reference. In addition, a claim of priority under 35 U.S.C. §119 is made to Korean Patent Application No. 2006-82982, filed Aug. 30, 2006, and Korean Patent Application No. 2007-32854, filed Apr. 3, 2007, the entire contents of which are herein incorporated by reference.

BACKGROUND

The present invention disclosed herein relates to semiconductor memory devices and more particularly, to nonvolatile semiconductor memory devices storing multi-bit data.

Semiconductor memory devices are generally classified as either volatile or nonvolatile memories. Volatile semiconductor memory devices lose stored data in the absence of supplied power, whereas non-volatile semiconductor memory device retain stored data even when the supply of power is interrupted. Examples of nonvolatile semiconductor memory devices include mask ROMs (MROMs), programmable ROMs (PROMs), erasable and programmable ROMs (EPROMs), electrically erasable and programmable ROMs (EEPROMs), and so on. Among these, the flash-type EEPROM (hereinafter, referred to as 'flash memory') is especially suited as a large-capacity auxiliary storage unit since it allow for a high integration density when compared with more conventional EEPROMs.

Flash memories are usually classified as either NOR type or NAND type flash memories in accordance with the manner in which the memory cells thereof are connected to bit lines. The NOR flash memory is configured such that one bit line is coupled to two or more cell transistors in parallel. Further, in the NOR flash memory, data is stored by channel hot electron injection and erased by Folwer-Nordheim (F-N) tunneling effect. In contrast the NAND flash memory is configured such that one bit line is coupled to two or more cell transistors in series. Also, in the NAND flash memory, data is stored and erased by means of the F-N tunneling effect. In general, the NOR flash memory is capable of relatively high frequency operations, but is difficult to implement at high densities due in part to its large power consumption. However, in an effort to increase cell density, NOR flash memories are being develop with multi-level cell (MLC) capabilities.

FIG. 1 is a diagram showing threshold voltage distribution profiles associated with data of flash memory cells in the MLC scheme. In contrast to a single-level cell scheme where each cell is programmed to one of two voltage distributions to store one-bit date, the MLC scheme of FIG. 1 is characterized by each cell being programmed into one of four different threshold voltage distributions to store two-bit data.

As an example, data values stored in the unit cell may be arranged in the order of '11', '10', '01', and '00' in the order of the lowest to highest threshold voltages. The lowest threshold voltage data '11' corresponds to an erased state, from which a programming operation begins. An MLC flash memory device storing multi-bit data in a single memory cell is disclosed, for example, in U.S. Pat. No. 6,101,125 entitled 'ELECTRICAL PROGRAMMING MEMORY AND METHOD OF PROGRAMMING'.

FIG. 2 is a flowchart illustrating a conventional MLC programming method operable in a NOR flash memory device, which is disclosed in the afore-mentioned U.S. Pat. No. 6,101,125.

Referring to FIG. 2, the MLC programming operation of the NOR flash memory device begins from the erased state '11'. The procedure of MLC programming is carried out in the sequence of programming data '10' (S100), program-verifying data '10' (S110), programming data '01' (S120), program-verifying data '01' (S130), programming data '00' (S140), and program-verifying data '00' (S150), in this order. The distribution profiles of threshold voltages must be densely controlled to be confined in their windows in correspondence with the four data states. For this reason, there has been proposed a programming routine using an incremental step pulse programming (ISPP) scheme. According to the ISPP scheme, a threshold voltage increases by an incremental portion of a program loop or voltage. In this manner, the distribution profiles of threshold voltages can be densely regulated by reducing the incremental portion of program voltage. This makes it possible to assure sufficient margins between the data states.

FIGS. 3 and 4 are waveform diagrams showing examples of variations of word line voltages Vpgm and Vvfy and a bulk voltage $V_{BULK}$ that are applied thereto during the conventional MLC programming operation according to the ISPP scheme.

From FIGS. 2 through 4, it can be seen that the conventional multi-bit programming operation is carried out by alternate execution of programming and program-verifying steps with a stepped-up program voltage. For example, as shown in FIG. 3, after a first program voltage Vpgm10_step1 is applied to conduct a first programming step, a program-verifying step begins with a verifying voltage Vvfy10. Thereafter, a second program voltage Vpgm10_step2 higher than Vpgm_step1) is applied to conduct a second programming step and then another program-verifying step begins with the verifying voltage Vvfy10. In FIGS. 3 and 4, the verifying voltage Vvfy10 is higher than the program voltages Vpgm10_step1 and Vpgm10_step2.

Generally, in the conventional multi-bit programming mode where the program voltages (e.g., Vpgm10_step1, Vpgm10_step2, and so on) alternate with the verifying voltage (e.g., Vvfy10), it is essentially required of recovery and setup periods to rapidly change voltage levels for every generation of the voltages. As a result, such frequent generation of the recovery and setup periods increases a programming time, and can also result in an inadvertent voltage overshoot. These drawbacks may also arise from the bulk voltage, as well as the word line voltages, as shown in FIG. 4.

SUMMARY OF THE INVENTION

Exemplary embodiments of the present invention are directed to a program method of a flash memory device including a plurality of memory cells each being programmed in one of a plurality of data states. In an exemplary embodiment, the program method includes programming selected memory cells in a first data state, verifying a result of the programming, successively programming selected memory cells in at least two or more data states corresponding to threshold voltages which are lower than a threshold voltage corresponding to the first data state, and verifying results of the successive programming.

In another exemplary embodiment, the method includes programming selected memory cells in a first data state, verifying a result of the programming to the first data state, programming selected memory cells in a second data state, programming selected memory cells in a third data state, verifying a result of the programming to the second data state, and verifying a result of the programming to the third data state. Here, a threshold voltage corresponding to the third data state is higher than a threshold voltage corresponding to the second data state, and a threshold voltage corresponding to the first data state is higher than a threshold voltage corresponding to the third data state.

Exemplary embodiments of the present invention are directed to a flash memory device. In an exemplary embodiment, the flash memory device is provided which includes a memory cell array including a plurality of memory cells, each memory cell being programmable in one of a plurality of data states corresponding one of a plurality of threshold voltage. The flash memory device further includes a controller configured to regulate programming and program-verifying operations for the memory cells, a voltage generator configured to generate a plurality of word line voltages to be used for the programming and program-verifying operations in response to regulation by the controller, a write driver configured to program the memory cells in response to regulation by the controller, and a pass/fail check circuit configured to check programmed data in response to regulation by the controller. The controller regulates the programming and program-verifying operations to program selected memory cells into a first data state, to successively program remaining memory cells into at least two or more data states corresponding to threshold voltages which are lower than a threshold voltage corresponding to the first data state, and to verify results of the successive programming.

In another exemplary embodiment, the program method includes dividing the plurality of memory cells into a plurality of groups according to target threshold voltage level, programming memory cells belonging to a first group corresponding to a highest data target threshold voltage level among the plurality of groups, and programming memory cells belonging to a second group corresponding to target threshold voltage levels which are lower than the target threshold voltage level corresponding to the first group. Here, the memory cells belonging to the second group include memory cells programmed in at least two target threshold voltage states and successively receive a plurality of program voltages corresponding to the at least two target threshold voltage states.

In another exemplary embodiment, the program method includes dividing the plurality of memory cells into a highest group and remaining groups according to a target threshold voltage level, programming memory cells belonging to the highest group, and programming memory cells belonging to the remaining groups. Here, each of the remaining groups includes memory cells programmed in at least two target threshold voltage states and successively receive a plurality of program voltages corresponding to the least two target threshold voltage states.

BRIEF DESCRIPTION OF THE FIGURES

Non-limiting and non-exhaustive embodiments of the present invention will be described with reference to the accompanying figures, wherein like reference numerals refer to like parts throughout the various figures unless otherwise specified. In the figures:

FIGS. 9A through 9C illustrate a method of grouping a 3-bit MLC in accordance with an embodiment of the present invention;

FIGS. 11A through 11C are waveform diagrams showing program operations corresponding to the diagrams of FIGS. 9A through 9C, respectively;

FIGS. 12A through 12C illustrate a method of grouping a 4-bit MLC in accordance with an embodiment of the present invention;

DETAILED DESCRIPTION OF PREFERRED EMBODIMENTS

Figure 1:
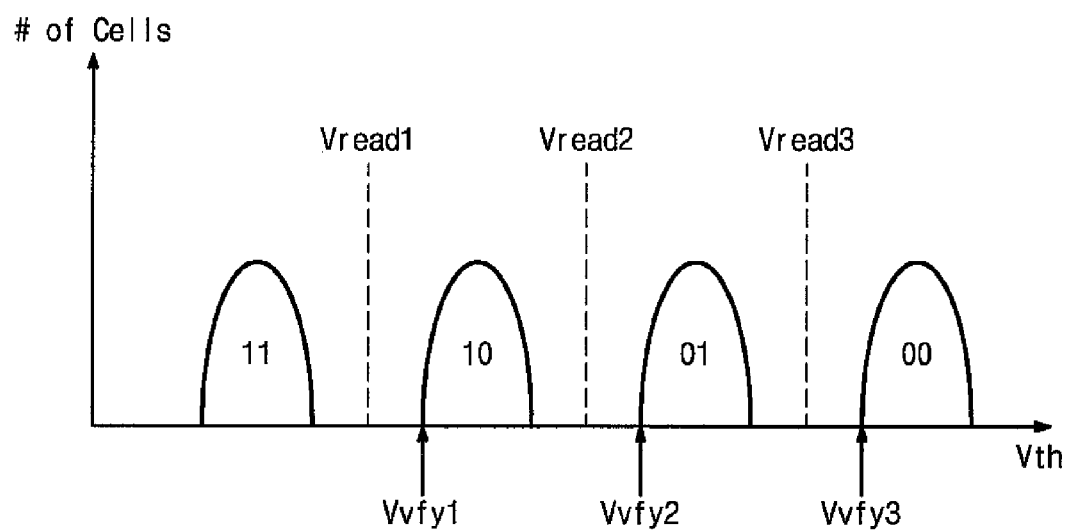
FIG. 1 is a diagram showing threshold voltage distribution profiles associated with data of flash memory cells in the MLC scheme.
Figure 2:
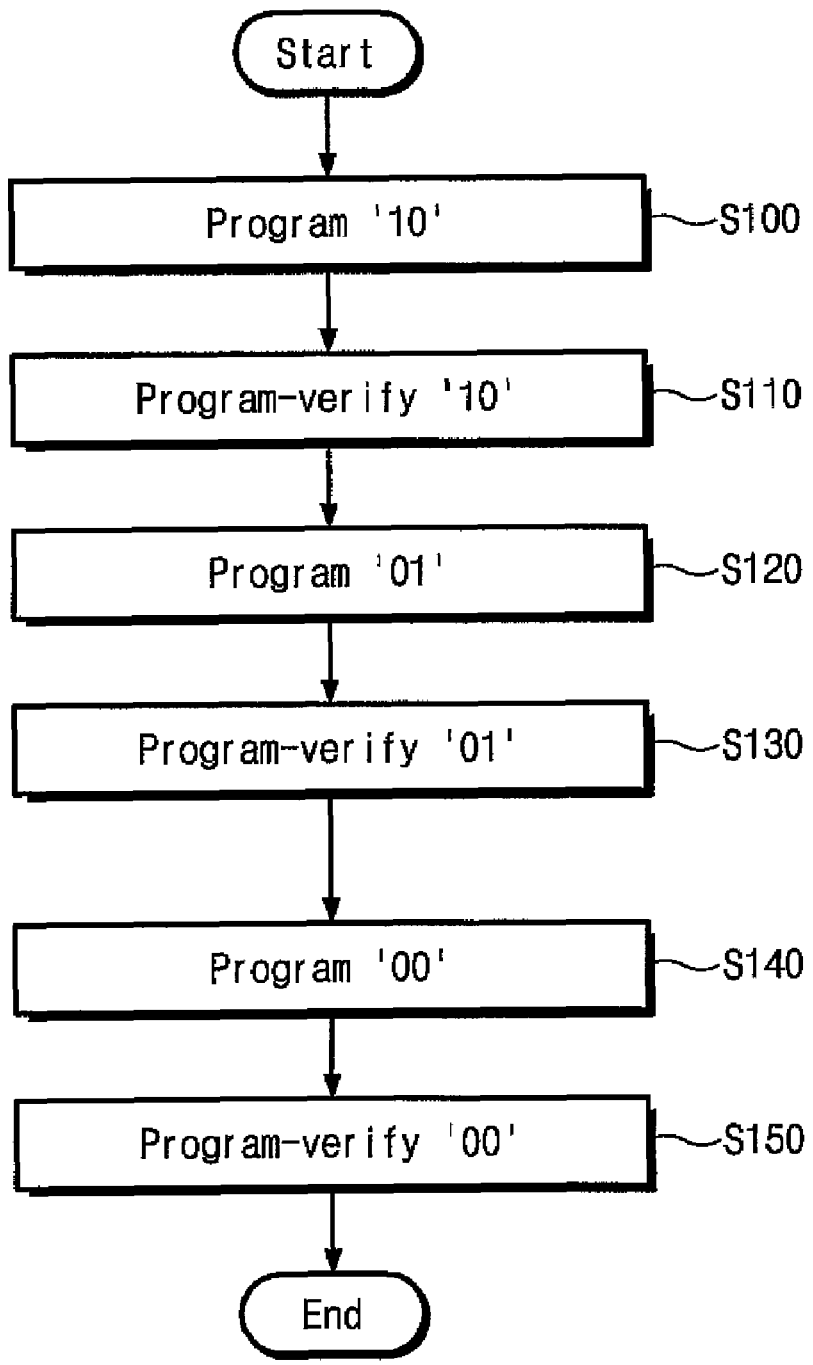
FIG. 2 is a flowchart illustrating a conventional MLC programming method operable in a NOR flash memory device.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

Hereinafter, exemplary but non-limiting embodiments of the present invention will be described.

As will be described in detail below, a flash memory device according one or more embodiments of the present invention is operable according to an operational procedure of first programming selected memory cells into a first data state that has the highest threshold voltage in a plurality of data states, then continuously programming the selected memory cells into at least two or more data states lower than the first data states, and continuously verifying results of the sequential programming operations. According to this programming scheme, it is possible to reduce the frequencies of recovery and setup operations for word line voltages and a bulk voltage, thus shortening a programming time thereof Additionally, the programming scheme lessens a difference between the word line voltages successively generated and hence prevents or minimizes overshoots of voltages.

Figure 5:
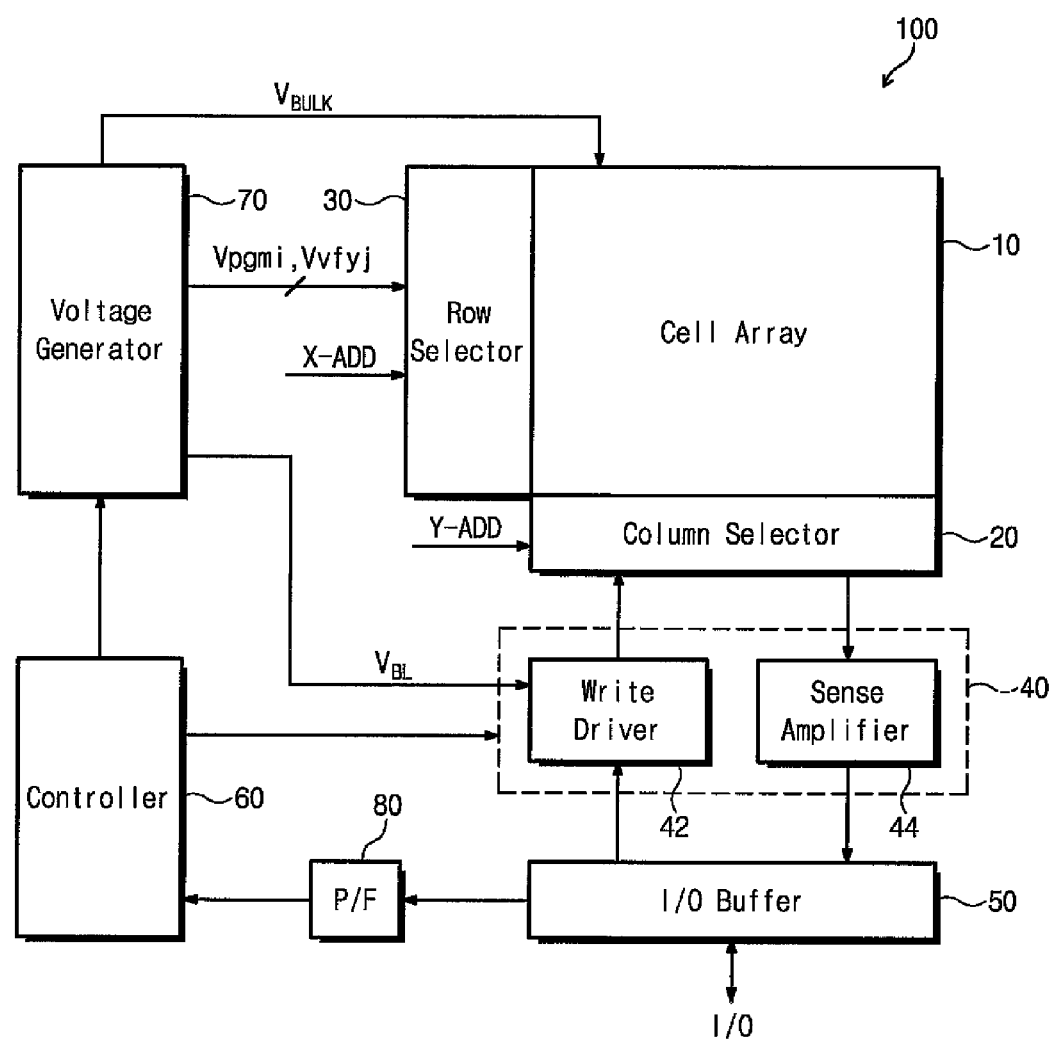
FIG. 5 is a block diagram illustrating an overall structure of a flash memory device in accordance with an embodiment of the present invention.

FIG. 5 is a block diagram illustrating an overall structure of a flash memory device 100 in accordance with an embodiment of the present invention. The flash memory device 100 shown in FIG. 5 is exemplarily illustrated as a NOR type operable in an MLC data storage scheme.

Referring to FIG. 5, the flash memory device 500 includes a memory cell array 10, a column selector 20, a row selector 30, a data input/output (I/O) circuit 40, an input/output (I/O) buffer 50, a controller 60, a voltage generator 70, and a pass/fail check circuit (P/F) 80.

The memory cell array 10 includes pluralities of memory cells arranged at intersections of plural rows (i.e., word lines) and columns (i.e., bit lines). In the example of this embodiment, each memory cell is an MLC programmable in one of plural state values ('11', '10', '01', and '00') as shown in FIG. 1.

The voltage generator 70 provides varieties of static voltages, e.g., a program voltage Vpgmi, a verifying voltage Vvfyi, a bit line voltage $V_{BL}$, and a bulk voltage $V_{BULK}$, and so forth, required for programming, erasing, and reading the memory cells. The row selector 30 operates to select one of the static voltages from the voltage generator 70 in response to a row address X-ADD, and applies the selected voltage to a word line corresponding thereto. The column selector 20 operates to select a bit line connected to a memory cell to be programmed or read, among memory cells belonging to a selected word line, in response to a column address Y-ADD.

The I/O buffer 50 stores data programmed in the memory cell array 10 or data sensed from the memory cell array 10. The data I/O circuit 40 is composed of a write driver 42 and a sense amplifier 44. The write driver 42 functions to program a selected memory cell with program data received from the I/O buffer 50. The sense amplifier 44 detects data programmed in a selected memory cell. Data detected by the sense amplifier 44 is stored in the I/O buffer 50. The sensed data stored in the I/O buffer 50 is verified for its programmed result by means of the pass/fail check circuit 80. A result of program verification by the pass/fail check circuit 80 is provided to the controller 60. The controller 60 regulates the programming operation in response to the program verification result provided from the pass/fail check circuit 80. The programming operation of the present embodiment is an MLC programming operation for writing multi-bit data in a unit flash memory cell. The controller 60 also regulates overall functions relevant to operations of erasing and reading the flash memory device, in addition to the programming operation.

As described hereinafter, the controller 60 conducts an MLC programming mode utilizing a sequence of programming and program-verifying steps which differ from those of the conventional MLC programming mode. Namely, the controller 60 causes the MLC programming mode to be carried out such that after completing at least two programming steps, program-verifying steps are successively conducted to check results of the former programming steps. To this end, the controller 60 operates to control generation of the program voltage Vpgmi, the verifying voltage Vvfyi, the bit line voltage $V_{BL}$, and the bulk voltage $V_{BULK}$ in correspondence with the sequential steps of the programming operation. The number of the successive programming and program-verifying steps is variable in accordance with the number (or kinds) of data state values programmable in the memory cell.

For example, according to the programming scheme of the present embodiment, it is possible to reduce recovery and setup time for the program voltage Vpgmi, the verifying voltage Vvfyi, and the bulk voltage $V_{BULK}$ to about half that of the conventional schemes. Also, it is possible to reduce gaps between the voltages, which are generated during the programming procedure, relative to the conventional schemes. Voltage overshoots can thus be minimized.

Figure 6:
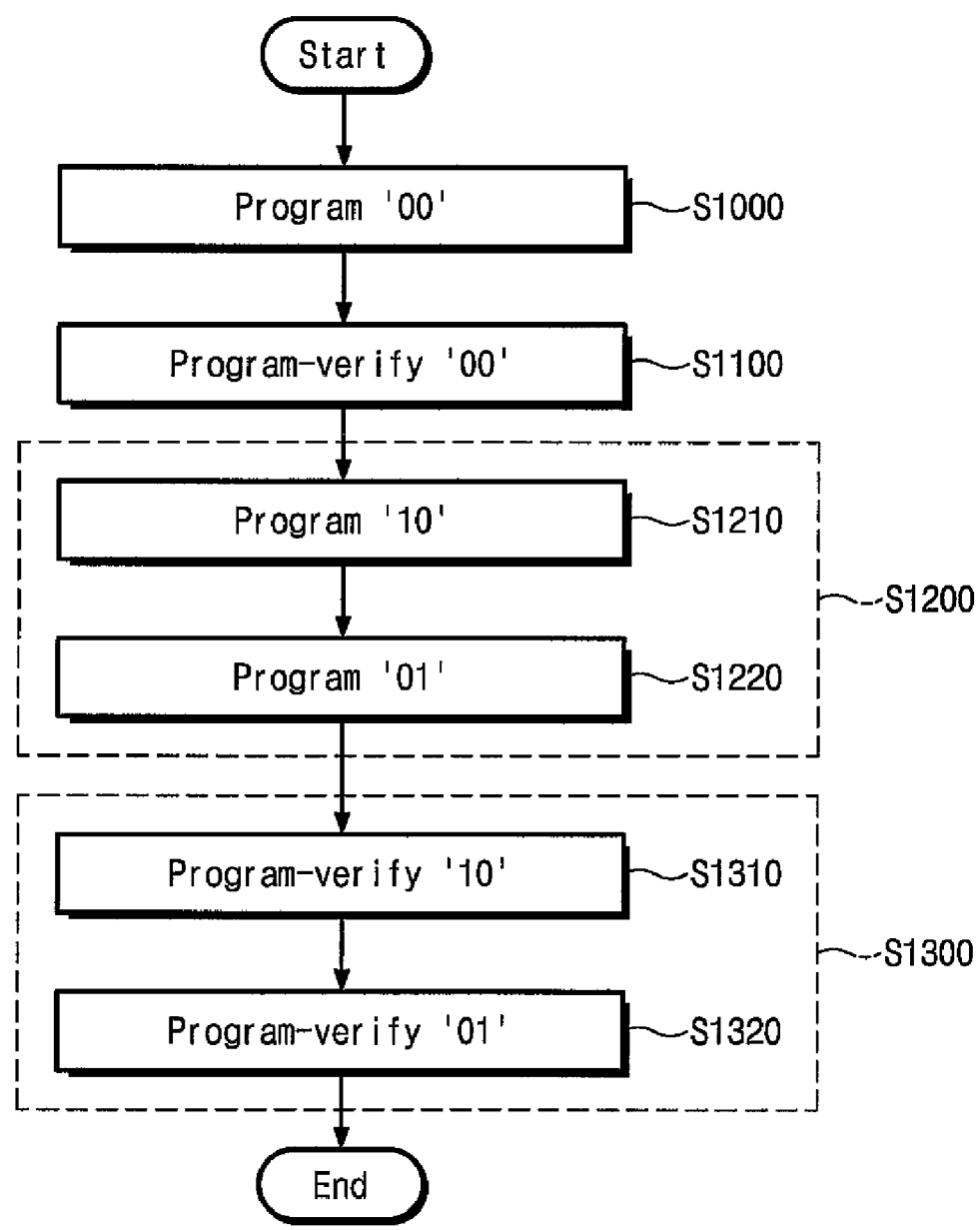
FIG. 6 is a flowchart illustrating an MLC programming method in accordance with an embodiment of the present invention.

FIG. 6 is a flowchart illustrating the MLC programming method in accordance with an embodiment of the present invention. In this example, data are programmed by the process shown in FIG. 6 in one of four threshold voltage distribution profiles respectively corresponding to data states '11', '10', '01', and '00' where state '11' of the lowest threshold voltage denotes an erased memory cell. A memory cell programmed in the state '10' has a threshold voltage which is higher than that of a memory cell of the state '11'; a memory cell programmed in the state '01' has a threshold voltage which is higher than that of a memory cell of the state '10'; a memory cell programmed in the state '00' has a threshold voltage which is higher than that of a memory cell of the state '01'. This particular distribution pattern of threshold voltages is presented here as an example only.

As well known by those skilled in the art, over-erasure is considered a serious and problematic issue since it can result in malfunction of a NOR flash memory device. In contrast, over-writing or over-programming is considered less of an issue since it is rarely results in malfunctions in a NOR flash memory device. The embodiment as shown in FIG. 6 is configured to first conduct steps of programming data '00' (S1000) and program-verifying the programmed data '00' (S1100), using a sufficiently high program voltage. The state of data '00' by the steps S1000 and S1100 corresponds to the highest threshold voltage among the four data states. Then, operations for programming memory cells in the remaining states, i.e., steps of programming data '10' (S1210) and programming data '01' (S1220), are carried out in sequence (S1200). Subsequently, operations for program-verifying corresponding to the former programming operations, i.e., steps of program-verifying data '10' (S1310) and program-verifying data '01' (S1320), are carried out in sequence (S1300).

As illustrated in FIG. 1, the threshold voltage distribution profiles of the data states '01' and '01' are adjacent to each other. In order to confine the threshold voltages of the states '10' and '01' within their predetermined distribution windows, their programming operations should be precisely controlled to a greater degree than the programming operation for the data state '00'. Thus, as aforementioned, the present embodiment is implemented by separating from each other the operations of programming the data state '00' (for which precise programming is unnecessary), and programming the data states '10' and '01' (for which precise programming is necessary). The steps of programming and program-verifying the data group of '10' and '01' are carried out after completing the programming step for the data '00'.

Hereinafter, an explanation will be presented with respect to variations of the word line voltages Vpgm and Vvfy and the bulk voltage VBULK which are used in the successive programming steps S1210 and S1220 for the data states '10' and '01' and the successive program-verifying steps S1310 and S1320.

Figure 7:
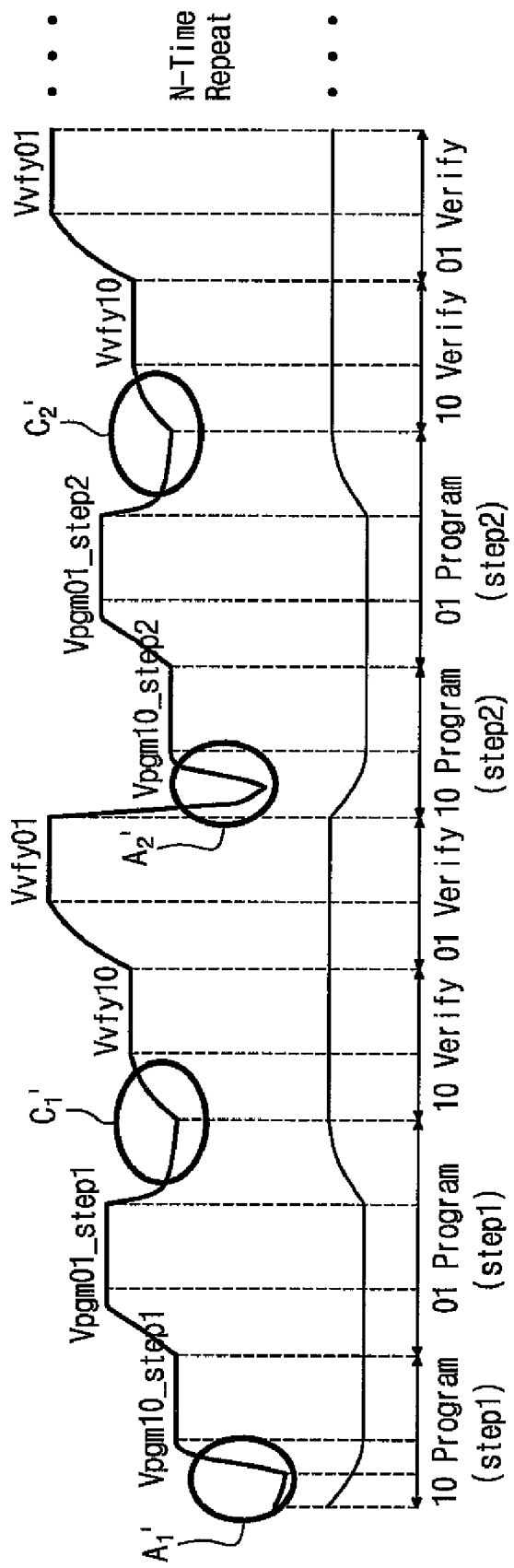
FIGS. 7 and 8 are waveform diagrams showing variations of word line voltages Vpgm and Vvfy and a bulk voltage $V_{BULK}$ that are applied thereto during the MLC programming operation shown in FIG. 6.
Figure 8:
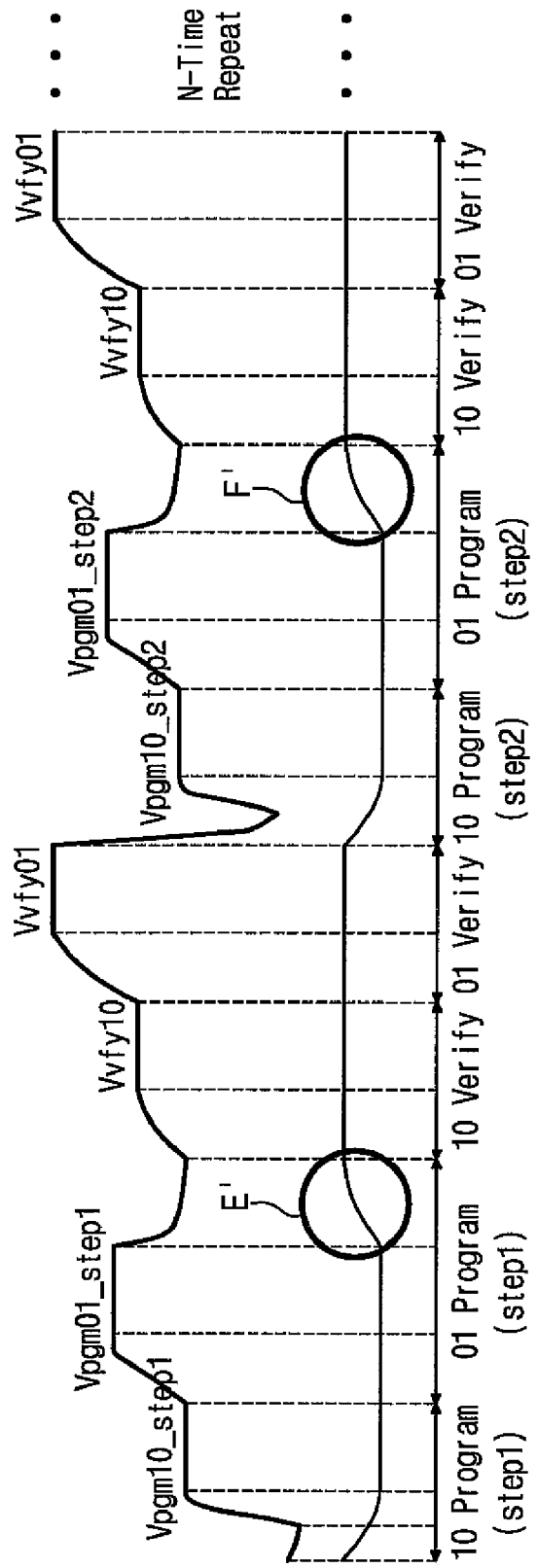

FIGS. 7 and 8 are waveform diagrams showing variations of the word line voltages Vpgm and Vvfy and the bulk voltage $V_{BULK}$ that are applied thereto during the MLC programming operation shown in FIG. 6. FIGS. 7 and 8 exemplarily show variations of the word line voltages Vpgm and Vvfy and the bulk voltage $V_{BULK}$ that are used in the MLC programming operation under the ISPP scheme.

Referring to FIGS. 6 through 8, in the MLC programming method according to the present embodiment, two programming steps are carried out with stepped-up program voltages and then the program-verifying steps are carried out to check results of the programming steps. For instance, after conducting a first programming step with a first program voltage Vpgm10_step1, a second programming step is subsequently carried out with a second program voltage Vpgm01_step1. Then, a first program-verifying step is carried out with a first verifying voltage Vvfy10 and next a second program-verifying step is carried out with a second verifying voltage Vvfy01. Here, the verifying voltages Vvfy10 and Vvfy01 are higher than the program voltages Vpgm10_step1 and Vpgm01_step1 corresponding thereto. The second verifying voltage Vvfy01 is higher than the first verifying voltage Vvfy10, and the second program voltage Vpgm01_step1 is higher than the first program voltage Vpgm10_step1. The program voltages Vpgm10_step1 and Vpgm01_step1 are included in the same step of the ISPP scheme.

Figure 3:
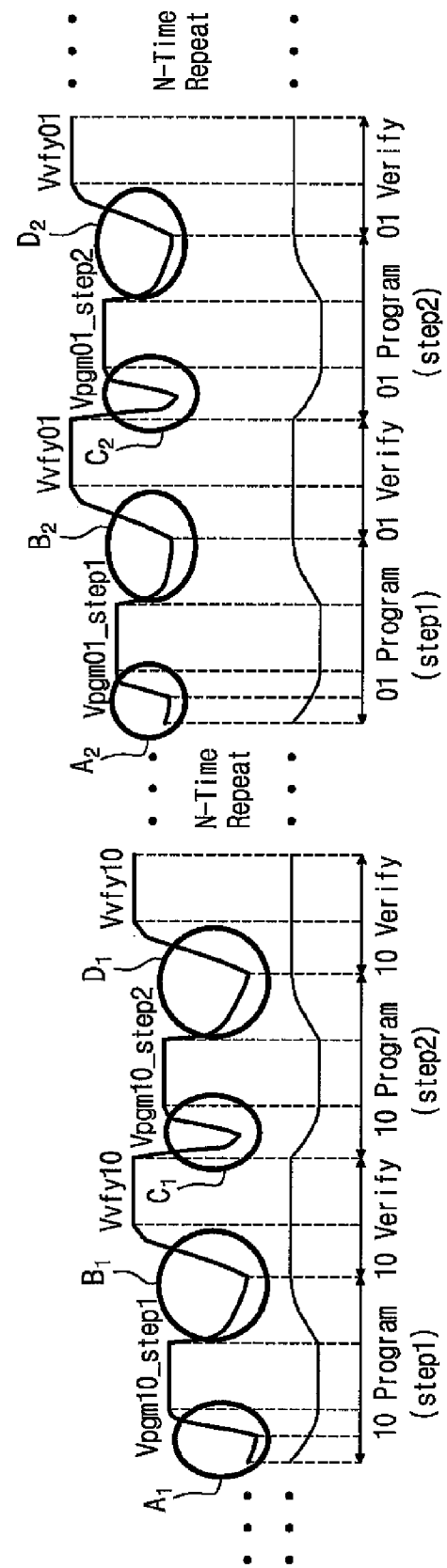
FIGS. 3 and 4 are waveform diagrams showing variations of word line voltages Vpgm and Vvfy and a bulk voltage $V_{BULK}$ that are applied thereto during the conventional MLC programming operation.

Referring to FIGS. 3 and 7, the word line voltages Vpgm10_step1, Vpgm01_step1, Vvfy10, Vvfy01, and so on, according to the present embodiment will now be compared with the conventional word line voltages in characteristics.

As illustrated in FIG. 3, the conventional MLC programming mode is carried out by alternately generating the program voltages Vpgm10_step1 and Vpgm10_step2 and the plural verifying voltages Vvfy10. Thus, it is required of the recovery and setup periods (A1, B1, C1, D1, A2, B2, C2, and D2) to generate each voltage, increasing a programming time. In addition, the voltage levels shown in FIG. 3 are irregular and different from each other, thus causing overshoots during the setup period. These problems of the conventional case are further aggravated when the flash memory device is equipped with a pump circuit for generating the program and verifying voltages.

In contrast, the MLC programming mode of the present embodiment as shown in FIG. 7 is conducted by sequentially generating the stepped-up program voltage and the verifying voltage two times. As a result, the recovery and setup periods, A1', C1', A2', and C2', are reduced to half that of the conventional scheme. Also, as the voltages generated are leveled in small voltage gaps and regularized in incremental portions, overshoots can be substantially reduced in the voltage setup periods.

Figure 4:
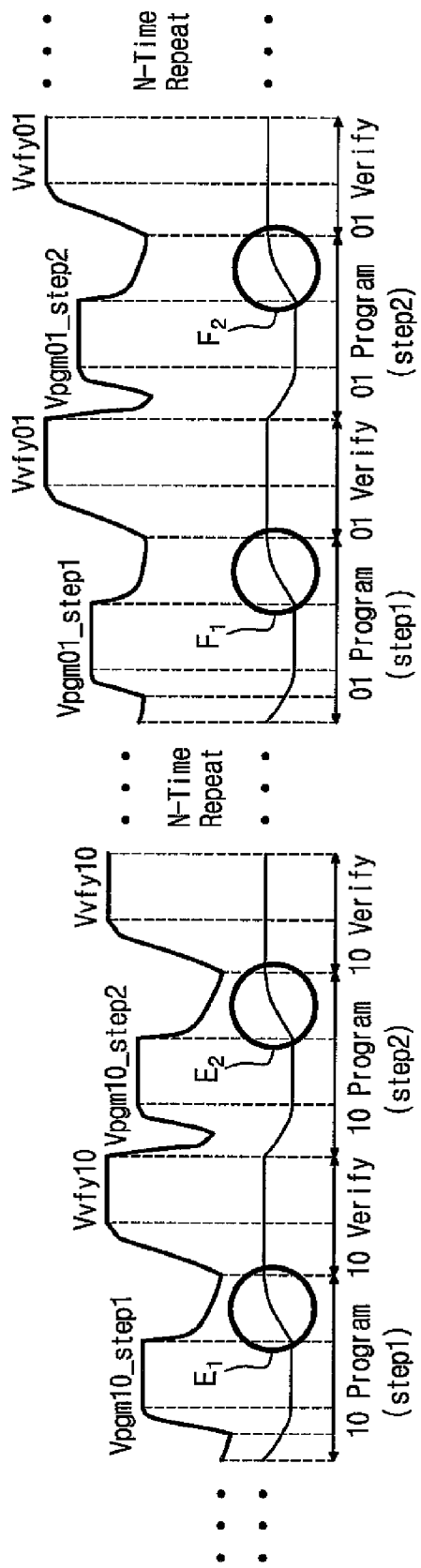

Referring to FIGS. 4 and 8, generation of the bulk voltage $V_{BULK}$ of the present embodiment will now be compared with the conventional scheme.

In the conventional MLC programming scheme shown in FIG. 4, a negative bulk voltage $V_{BULK}$ is activated every generation with each of the stepped-up program voltages Vpgm10_step1, Vpgm10_step2, and so on. The negative bulk voltage $V_{BULK}$ is recovered to an initial value every generation with each of the verifying voltages Vvfy10 and Vvfy01. Namely, in the conventional MLC programming scheme, since the program voltages, Vpgm10_step1, Vpgm10_step2, and so on, alternate with the verifying voltages Vvfy10 and Vvfy01, the recovery of the bulk voltage $V_{BULK}$ occurs frequently (see E1, E2, F1, and F2 in FIG. 4).

In contrast, in the MLC programming scheme of the present embodiment, it can be seen from FIG. 8 that the recovery times of the bulk voltage $V_{BULK}$ is reduced to half that of the conventional scheme (see E' F' in FIG. 8). The smaller recovery times of the bulk voltage is permissible because the program and verifying voltages are continuously generated twice with a sequentially stepped-up pattern and the bulk voltage $V_{BULK}$ set up once can be used for at least two programming steps. Thus, the recovery and setup periods for the bulk voltage $V_{BULK}$ are shortened to a half that of the conventional scheme, reducing the overall programming time in the flash memory device.

As described above, the present invention offers an advantage of efficiently shortening a programming time along with minimizing overshoots in a multi-bit flash memory device.

Figure 9C:
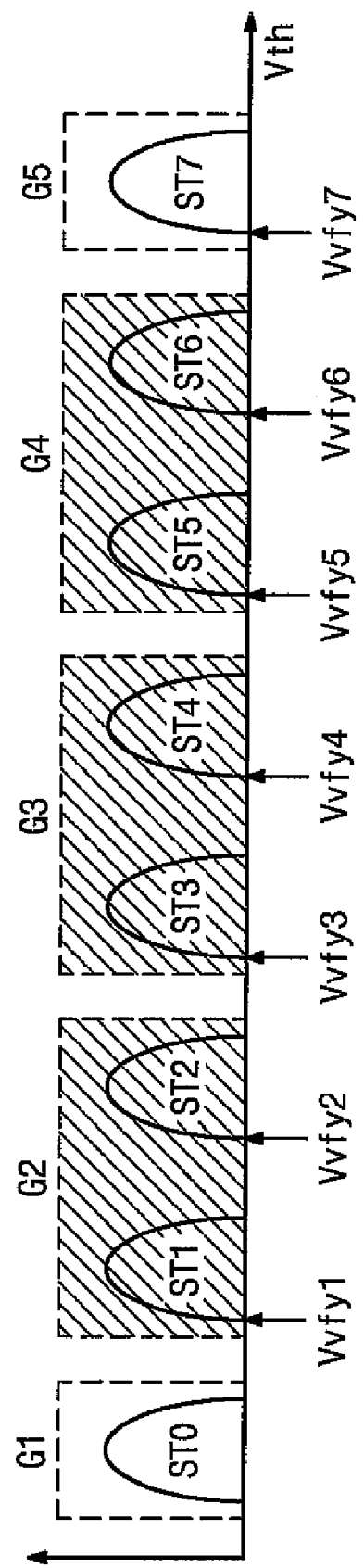

FIGS. 9A through 9C illustrate states of a threshold voltage of an MLC in which 3 bits of data are stored per cell and the MLC is grouped according to the states.

Referring to FIG. 9A, a 3-bit MLC is programmed in one of 8 threshold voltage profiles respectively corresponding to eight data states. Target threshold voltage states in which the 3-bit MLC is to be programmed are divided into two groups. Memory cells whose target threshold voltage states are ST1-ST6 are selected as a first group G1, and memory cells whose target threshold voltage state is ST7 are selected as a second group G2. When a program operation starts, memory cells included in the second group G2 are programmed from the initial erased state. The program operation for the memory cells included in the second group G2 conforms to the typical cycle in which one program voltage pulse and a verify voltage pulse are alternately applied. When the program voltage for the cells included in the second group G2 ends, a program operation for cells included in the first group G1 starts. During the program operation for the cells included in the second group G1, program pulses corresponding to their targets states are successively supplied. Thereafter, verify voltages Vvfy1-Vvfy6 corresponding to their target states are successively supplied to the memory cells included in the first group G1. A recovery operation of a bulk voltage $V_{BULK}$ for programming and a setup operation of a wordline voltage $V_{WL}$ are conducted between a supply period of the above program voltage pulses and a supply period of verify voltage.

FIG. 9B illustrates an embodiment in which the threshold voltage states of the 3-bit MLC are divided into three groups. Cells to be programmed in threshold voltage states ST1-ST3 belong to a first group G1, cells to be programmed in threshold voltage states ST4-ST6 belong to a second group G2, and cells to be programmed in a threshold voltage state ST7 belong to a third group G3. The cells included in the third group G3 are programmed to have a threshold voltage corresponding to the threshold voltage state ST7. A program operation is conducted for the memory cells included in the first group G1. Program voltages corresponding to the target states ST1, ST2, and ST3 are successively applied to wordlines of the memory cells included in the first group G1. After applying program voltages three times, verify voltages corresponding to the target states ST1-ST7 are to be successively applied to wordlines of the memory cells included in the group G1. The successive three-time application of program voltages and the successive three-time application of verify voltages are continuously executed until threshold voltages of memory cells are programmed into the target threshold voltages and determined to "pass". This program-verify method is applied to the memory cells included in the second group G2. If each of the memory cells included in the second group G2 is programmed in a target threshold voltage state, the program operation ends.

The program operation sequence of 'the third group G3→the first group G1→the second group G2' is presented as an example only, and the embodiment is not limited thereto. As one alternative example, the program operation for the second group G2 may precede the program operation for the first group G1.

FIG. 9C illustrates an embodiment in which states of a target threshold voltage for programming a 3-bit MLC are divided into four groups. Cells to be programmed in threshold voltage states ST1 and ST2 belong to a first group G1, cells to be programmed in threshold voltage states ST3 and ST4 belong to a second group G2, and cells to be programmed in threshold voltage states ST5 and ST6 belong to a third group G3. Further, cells to be programmed in the highest target threshold voltage state belong to a fourth group G4. Initially, the memory cells included in the fourth group G4 are programmed to have a threshold voltage corresponding to a threshold voltage state G7. The memory cells included in the groups G1, G2, and G3 are each programmed in their target states by applying program and verify voltages corresponding to two threshold voltage states. In this embodiment, the sequence of the first to third groups selected for program operations may be optional as specified by the user.

While a method of grouping a 3-bit MLC according to the states of target threshold voltages for program operations has been described with reference to accompanying drawings, the present invention is not limited to the drawings and the groups may be selected to include different numbers of target threshold voltage states.

Figure 10:
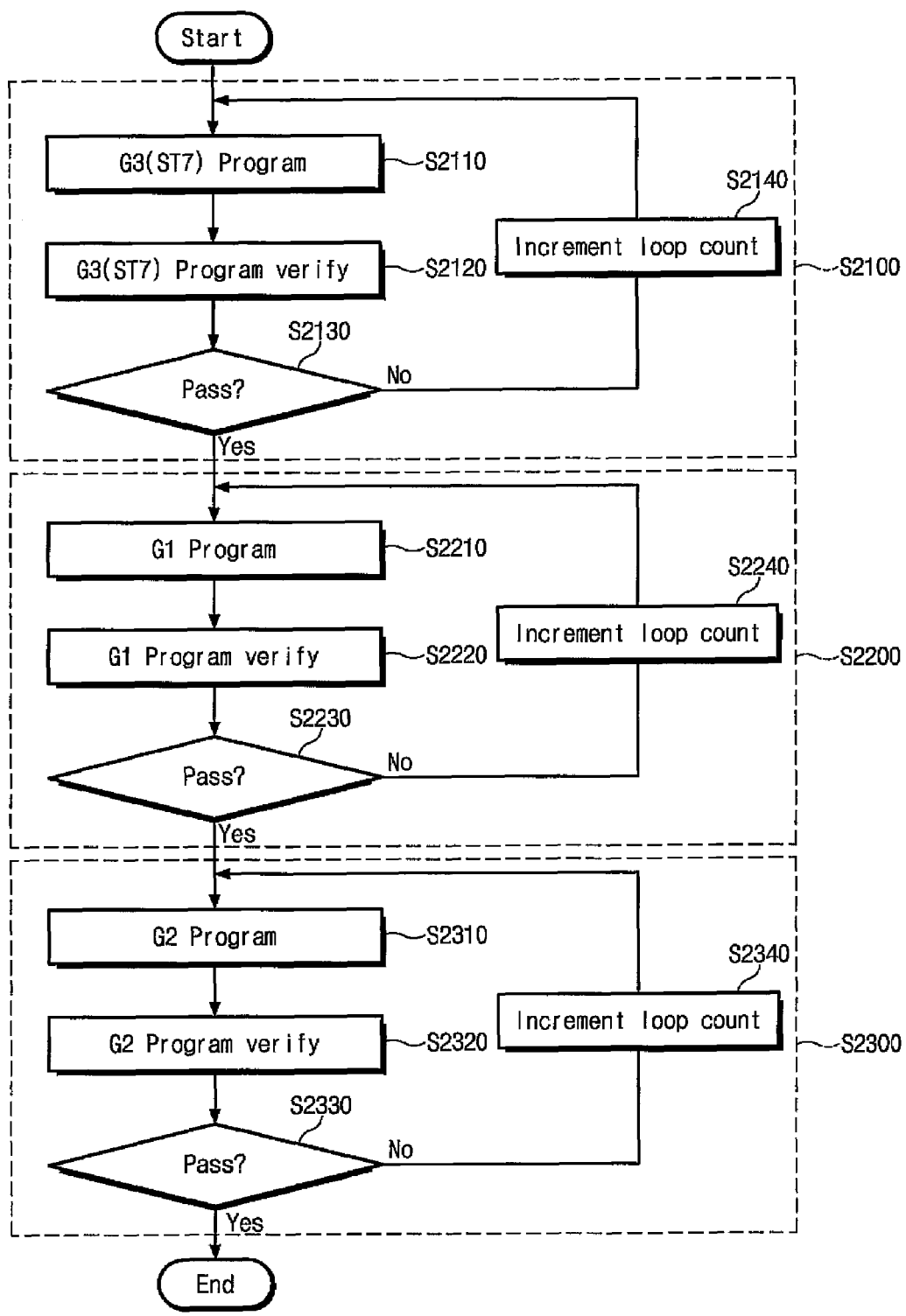
FIG. 10 is a flowchart illustrating a program method of the grouped 3-bit MLC according to FIG. 9B.

FIG. 10 is a flowchart illustrating a program operation according to the embodiment in which the MLC grouping method described in FIG. 9B. The program operation is conducted for the respective groups divided according to target threshold voltage states. The program operation according to this embodiment will now be described below in detail with reference to accompanying drawings.

When a program operation starts, memory cells to be programmed in a highest target threshold voltage are selected. The selected memory cells are programmed by means of the incremental step pulse programming (ISPP) in which one program voltage pulse and one verify voltage Vvfy7 are alternately applied to wordlines (S2100).

When programming memory cells included in a third group G3 is completed, memory cells included in the first group ST1, ST2, and ST3 are programmed based on the step S2200. The step S2200 includes a step S2210 in which a program voltage is applied to wordlines of the selected memory cells, a step S2220 in which a verify voltage is applied to determine whether the selected memory cells are programmed, and a step S2230 to check whether the programming is pass or fail. When the verify result is that the programming is fail, the selected memory cells are reprogrammed according to increment loop count in a step S2240. When the memory cells included in the first group G1 are all programmed with a target threshold voltage, this routine proceeds to the step S2300 in which memory cells included in the second group G2 are programmed.

The step S2300 includes a step 2310 in which memory cells included in the second group G2 are selected and a program voltage is applied to wordlines of the selected memory cells, a step 2320 to determine whether the selected memory cells are programmed, and a step S2330 in which the programming is pass or fail. When the verify result is that the programming is fail, the selected memory cells are reprogrammed according to increment loop count. If the memory cells included in the second group G2 are all programmed with a target threshold voltage, all program steps end.

The program steps described in FIG. 10 are steps of programming memory cells grouped using the method illustrated in FIG. 9B. In order to program an MLC grouped using the method described in FIG. 9A or 9C, program steps corresponding to the respective groups are added. However, in order to program each memory cell group, program voltages each corresponding to their target states are successively applied during a program period. Also, during a program verify period, verify voltages corresponding to their target states are successively applied to wordlines of the selected memory cells. According to the above program-verify method, it may be possible to decrease the recovery number of a bulk voltage $V_{BULK}$ and the setup number of a wordline voltage $V_{WL}$ during the program and verify operations.

Figure 11A:
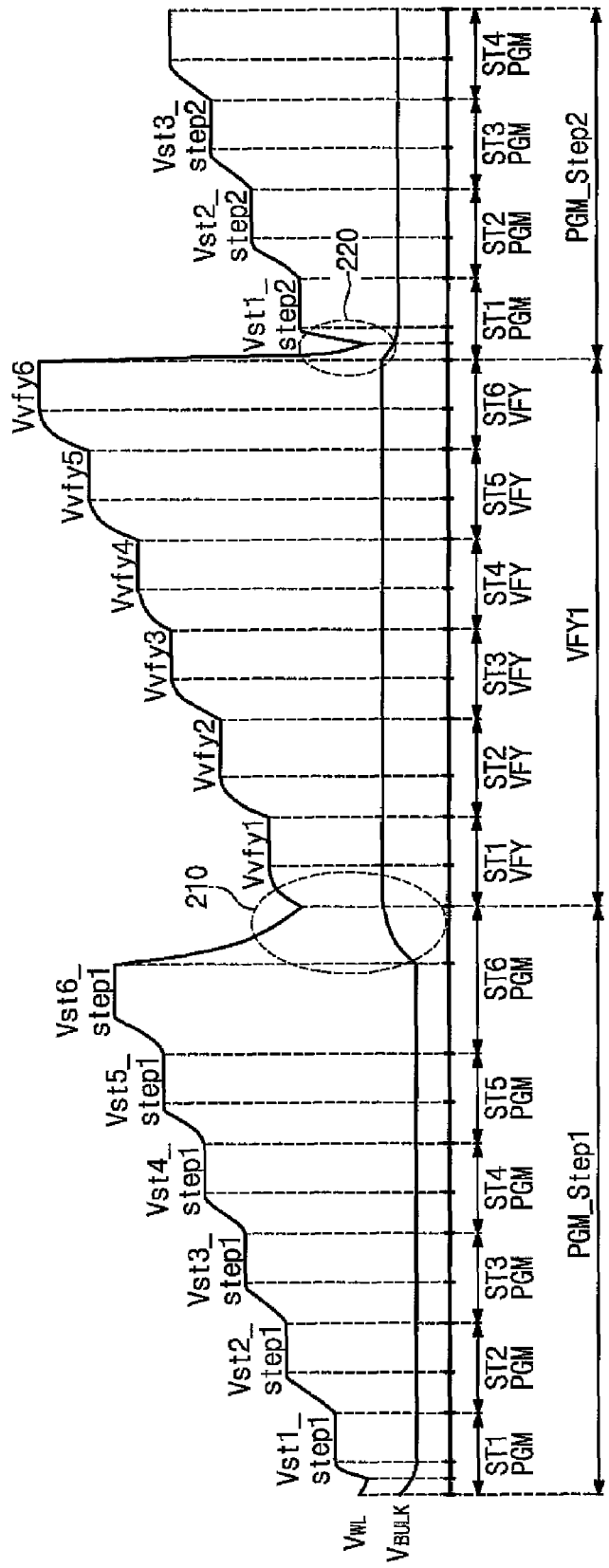
Figure 11C:
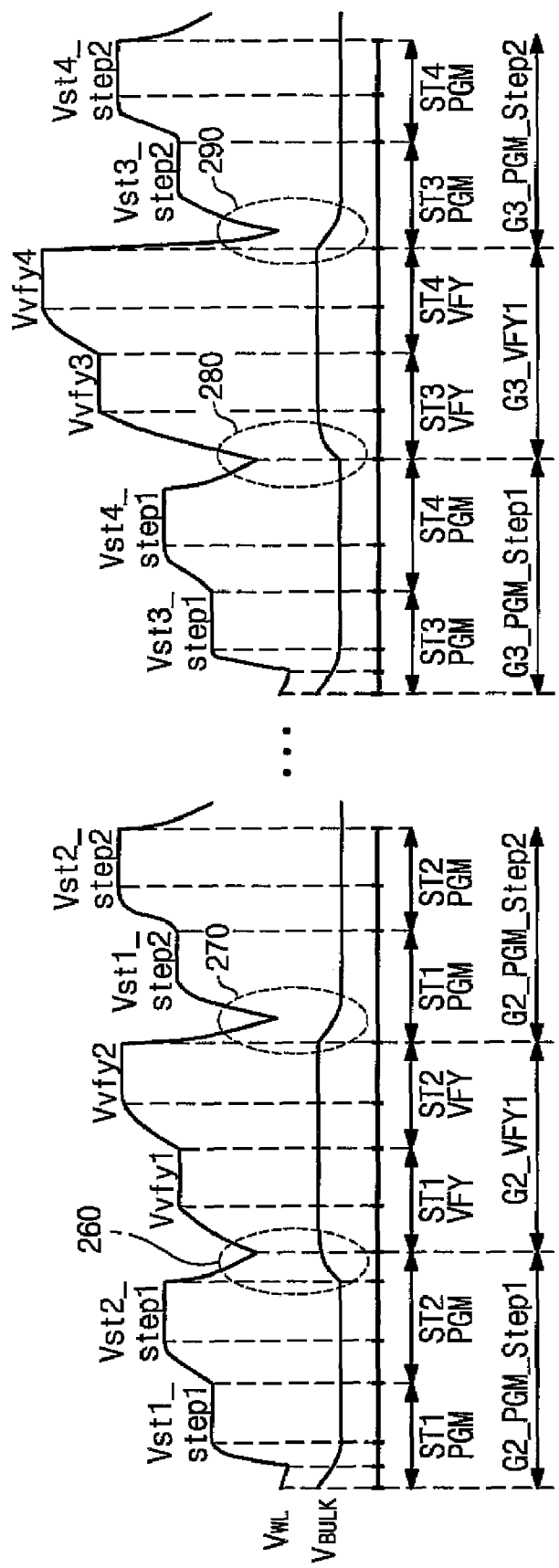

FIGS. 11A through 11C are waveform diagrams showing program operations of a 3-bit MLC corresponding to the diagrams of FIGS. 9A through 9C, respectively. The waveform diagrams show waveforms of voltages for programming memory cells of the other groups after a program operation is conducted in a threshold voltage state ST7. That is, the waveform diagrams show the time-based variation of program wordline voltages Vsti_stepj and Vvfyi and a bulk voltage $V_{BULK}$, respectively.

FIG. 11A illustrates a wordline voltage $V_{WL}$ and a bulk voltage $V_{BULK}$ for programming memory cells included in the first group of the 3-bit MLC described in FIG. 9A. During an initial period PGM_step1, program voltages Vsti1_step1-Vst6_step1 corresponding to six target threshold voltages ST1-ST6 are sequentially supplied to a wordline. When the supply of the program voltages Vsti1_step1-Vst6_step1 is completed, charges of the wordline are discharged and the bulk voltage $V_{BULK}$ of a bulk area biased at a negative voltage is recovered to an initial value. At this point, the fluctuation of the wordline and the biased voltage are shown in the portion designated by a reference numeral 210. During a verify period VFY1, verify voltages Vvfy1-Vvfy6 corresponding to the six target threshold voltages ST1-ST6 are sequentially supplied to the wordline. After supplying the verify voltages Vvfy1-Vvfy6, a second step step2 starts to program the selected memory cells with the increased program voltage. Here, the setup operation of the wordline voltage and the bulk voltage $V_{BULK}$ is conducted, which is shown in the portion designated by a reference numeral 220. According to the program method in which grouped are cells programmed using the method described in FIG. 9A, the setup and recover number of a wordline voltage $V_{WL}$ or a bulk voltage $V_{BULK}$ decreases by ⅙.

FIG. 11B illustrates a wordline voltage $V_{WL}$ and a bulk voltage $V_{BULK}$ for programming memory cells using the method described in FIG. 9B. During an initial period PGM_step1, program voltages Vsti1_step1-Vst3_step1 corresponding to three target threshold voltages ST1-ST3 are sequentially supplied to a wordline. The wordline, to which the program voltage Vsti1_step1-Vst3_step1 are supplied, is charged and a bulk area biased with a negative bulk voltage is recovered to an initial value. At this point, the fluctuation of a wordline voltage and a bias voltage are shown in the portion designated by a reference numeral 23. During a verify period VFY1, verify voltages Vvfy1-Vvfy3 corresponding to the three target threshold voltages ST1-ST3 are sequentially supplied to the wordline. After supplying the verify voltages Vvfy1-Vvfy3, a second step step2 starts to program the selected memory cells with the increased program voltage. Here, the setup operation of the wordline voltage and the bulk voltage $V_{BULK}$ is conducted, which is shown in the portion designated by a reference numeral 240. According to the program method in which grouped are cells programmed using the method described in FIG. 9B, the setup and recover number of a wordline voltage or a bulk voltage decreases by ⅓.

FIG. 11C illustrates a wordline voltage $V_{WL}$ and a bulk voltage $V_{BULK}$ for programming memory cells grouped using the method described in FIG. 9C. During an initial period G2_PGM_step1 to program a second group G2, program voltages Vsti1_step1-Vst2_step1 corresponding to two target threshold voltages ST1-ST2 are sequentially supplied to a wordline. A bulk area is biased with a negative voltage. When the supply of the program voltages Vsti1_step1-Vst2_step1 is completed, the bulk voltage $V_{BULK}$ biased with the negative voltage is recovered to an initial value to apply a verify voltage. At this point, the fluctuation of a wordline voltage and a bias voltage are shown in the portion designated by a reference numeral 260. During a verify period G2_VFY1, verify voltages Vvfy1-Vvfy2 corresponding to the two target threshold voltages ST1-ST2 are sequentially supplied to the wordline. After supplying the verify voltages Vvfy1-Vvfy6, a second step step2 starts to program the selected memory cells with the increased program voltage. Here, the setup operation of the wordline voltage and the bulk voltage $V_{BULK}$ is conducted, which is shown in the portion designated by a reference numeral 270. According to the program method in which grouped are cells programmed using the method described in FIG. 9C, the setup and recover number of a wordline voltage $V_{WL}$ or a bulk voltage $V_{BULK}$ decreases by ½.

As described above, a program voltage corresponding to a low threshold voltage state to a high program voltage increase at one program step period in which program voltages are successively supplied. However, the present embodiment is not limited to the description herein. For example, a program voltage corresponding to a high threshold voltage state to a program voltage corresponding to a low threshold voltage state may be supplied sequentially.

Figure 12C:
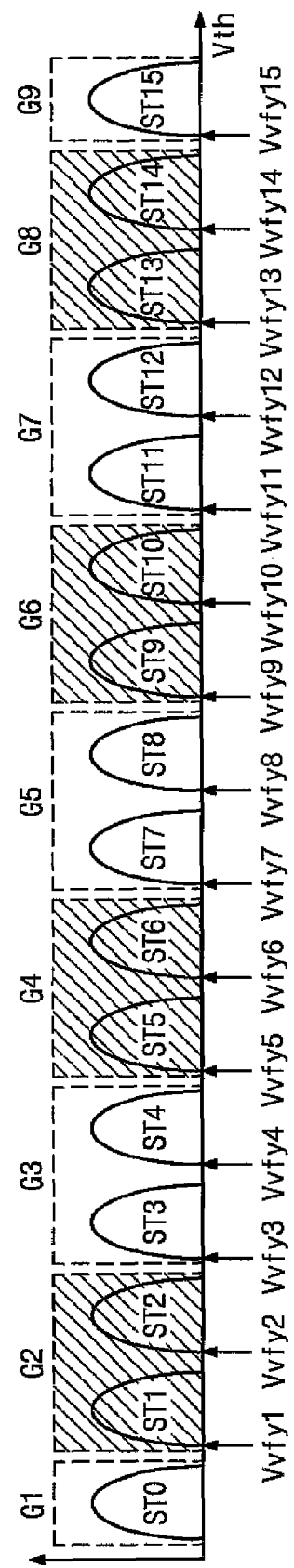

FIGS. 12A through 12C illustrate threshold voltage states of an MLC in which 4-bit data is stored per cell and a method of grouping the MLC according to the threshold voltage states.

Referring to FIG. 12A, a 4-bit MLC is programmed in one of 16 threshold voltage states corresponding to respective data. Target threshold voltage states in which the 4-bit MLC is to be programmed are divided into four groups. Memory cells whose target voltages are included in an erased state ST0 belong to a first group G1, memory cells whose target voltage are included in states ST1-ST7 belong to a second group G2, and memory cells whose target voltages are included in states ST8-ST14 belong to a third group G3. Further, memory cells whose threshold voltages are included in a highest threshold voltage state ST15 belong to a fourth group G4.

When a program operation starts, memory cells corresponding to the fourth group G4 are programmed from the initial erased state ST0. The program operation for the memory cells belonging to the fourth group G4 is a typical program cycle where one program voltage pulse and a verify voltage pulse are alternately applied. When the program operation for the memory cells belonging to the fourth group G4 is completed, a program operation for the cells belonging to the second group G2 starts. During the program operation for the cells belonging to the second group G2, program pulses each corresponding to their target states are successively supplied. Verify voltages Vvfy1-Vvfy7 each corresponding to their target states are successively supplied to the memory cells belonging to the second group G2. A recovery operation and a setup operation of the program voltage are conducted between a supply period of the program voltage pulses and a supply period of the verify voltages. When the program operation for the memory cells belonging to the second group G2 is completed, a program operation for the third group G3 starts.

FIG. 12B illustrates an embodiment in which target threshold voltage states of a 4-bit MLC are divided into six groups. An erase state belongs to a first group G1, cells to be programmed in threshold voltage states ST1-ST3 belong to a second group G2, cells to be programmed in threshold voltage states ST4-ST6 belong to a third group G3, cells to be programmed in threshold voltage states ST7-ST10 belong to a fourth group G4, and cells to be programmed in threshold voltage states ST11-ST14 belong to a fifth group G5. Further, cells to be programmed in a highest threshold voltage state ST15 belong to a sixth group G6. Initially, the cells belonging to the sixth group G6 are programmed to have a threshold voltage corresponding to the threshold voltage state ST15. A program operation for the memory cells belonging to the second group G2 is conducted. Program voltages each corresponding to their target states ST1, ST2, and ST3 are successively applied to wordlines of the memory cells belonging to the second group G2. After the program voltage is applied three times, verify voltages each corresponding to their target states are successively applied to the wordlines of the memory cells belonging to the second group G2. The three-times applying the program voltage and the three-times applying the verify voltage continue until threshold voltages of memory cells are programmed with target threshold voltages and judged to be "pass". The program-verify operation is identically applied to the memory cells belonging to the third group G3 to the fifth group G5. In particular, each of the fourth and fifth groups G4 and G5 has four target threshold voltage states. Thus, a program voltage pulse is supplied four times during the program operation for the memory cells belonging to the respective groups. Following the recovery operation, verify voltages each corresponding to their target states are to be successively supplied. In the sequence of the program operation, 'the sixth group G6' is an initial group. However, the present embodiment is not limited to the description herein. For example, the sequence of the program operations for the second group G2 to the fifth group G5 may be set optionally.

FIG. 12C illustrates an embodiment in which target threshold voltage states are divided into six groups to program a 4-bit MLC. Memory cells to be inhibited in an erased state belong to a first group G1, cells to be programmed in threshold voltage states ST1 and ST2 belong to a second group G2, cells to be programmed in threshold voltage states ST3 and ST4 belong to a third group G3, and cells to be programmed in threshold voltage states ST5 and ST6 belong to a fourth group G4. Further, memory cells to be programmed in a highest target threshold voltage state ST15 belong to a ninth group G9. Initially, the memory cells belonging to the ninth group G9 are programmed to have a threshold voltage corresponding to a threshold voltage state ST15. Memory cells belonging to the second group G2 to an eighth group G8 are programmed in target states by applying program and verify voltages each corresponding to two threshold voltage states. It will be apparent to those skilled in the art that the sequence of the second group G2 to the ninth group G9 may vary optionally.

While the methods for grouping a 4-bit MLC using the program method according to the present invention have been described with reference to accompanying drawings, the present embodiment is not limited to the drawings and the groups may be selected to include different numbers of target threshold voltage states.

Figure 13:
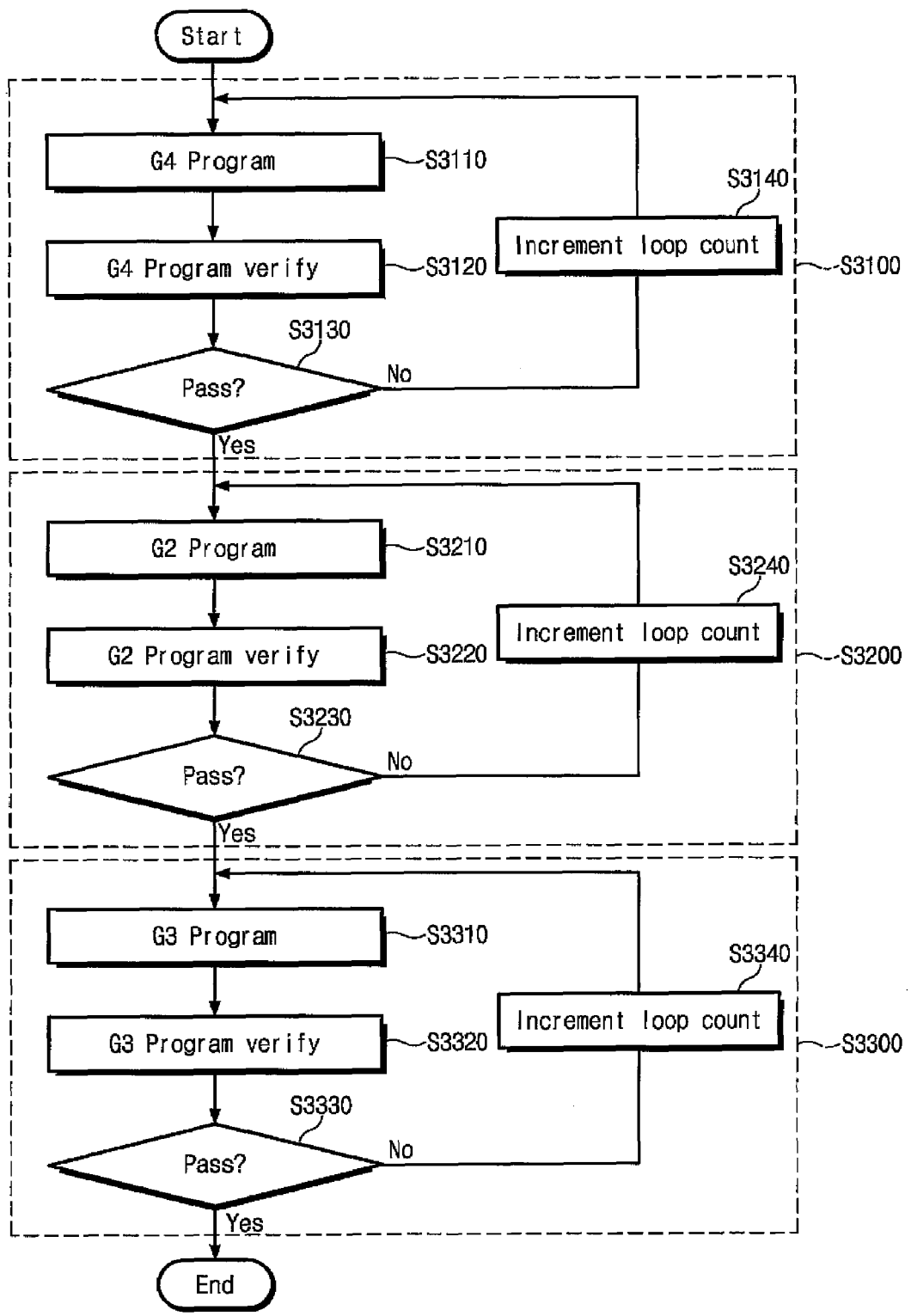
FIG. 13 is a flowchart illustrating a program method of the grouped 4-bit MLC according to FIG. 12A.

FIG. 13 is a flowchart illustrating a program operation of a 4-bit MLC grouped using the method described in FIG. 12A. The program operation is conducted for respective groups based on target threshold voltage states. The program operation will now be described below with reference to FIG. 13.

When the program operation starts, memory cells G4 to be programmed with a highest target threshold voltage ST15 are selected. The selected memory cells are programmed by means of typical incremental step pulse programming (ISPP) where one program voltage pulse and one verify voltage Vfy15 pulse are alternately applied to wordlines (S3100).

When the program operation for the memory cells belonging to the fourth group G4 is completed, memory cells belonging to the second group ST1-ST7 are programmed based on a step S3200. The step S3200 includes a step S3210 in which a program voltage is applied to wordlines of selected memory cells, a step S3220 in which a verify voltage is applied to determine whether the selected memory cells are programmed, and a step 3230 to judge whether the programming is pass or fail. If the judgment result of the programming is fail, the selected memory cells are reprogrammed according to increment loop count (S3240). If the memory cells belonging to the second group G2 are all programmed with a target threshold voltage, this routine proceeds to a step 3300 in which memory cells belonging to the third group G3 are programmed.

The step S3300 includes a step S3310 in which memory cells belonging to a third group ST8-ST14 are selected and a program voltage is applied to wordlines of the selected memory cells, a step S3320 in which a verify voltage is applied to determine whether the selected memory cells are programmed, and a step S3330 to judge whether the programming is pass or fail. If the verify result is that the programming is fail, the selected memory cells are reprogrammed according to increment loop count (S3340). If the memory cells belonging to the third group G3 are all programmed with a target threshold voltage, all program steps end.

The program steps illustrated in FIG. 13 are exemplary steps for programming memory cells grouped using the method described in FIG. 12A. In order to program an MLC grouped using the method described in FIG. 12B or 12C, program steps corresponding to respective groups are added. However, in order to program respective memory cell groups, program voltages each corresponding to their target states are successively applied at a program period. At a program verify period, verify voltages each corresponding to their target states are applied to wordlines. According to the program-verify method, it may be possible to conspicuously decrease the number of recover and setup operations conducted during the program-verify operation.

Figure 14A:
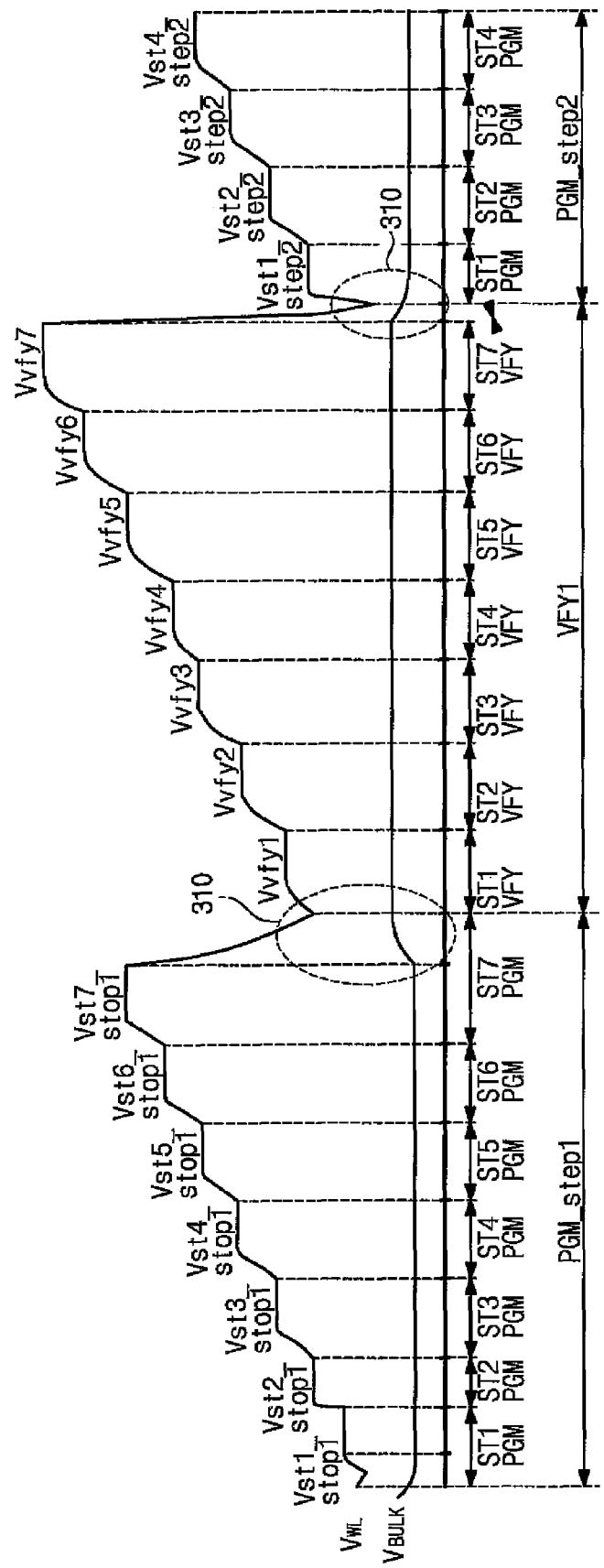
FIGS. 14A through 14C are waveform diagrams illustrating program operations corresponding to the diagrams of FIGS. 12A though 12c, respectively.
Figure 14B:
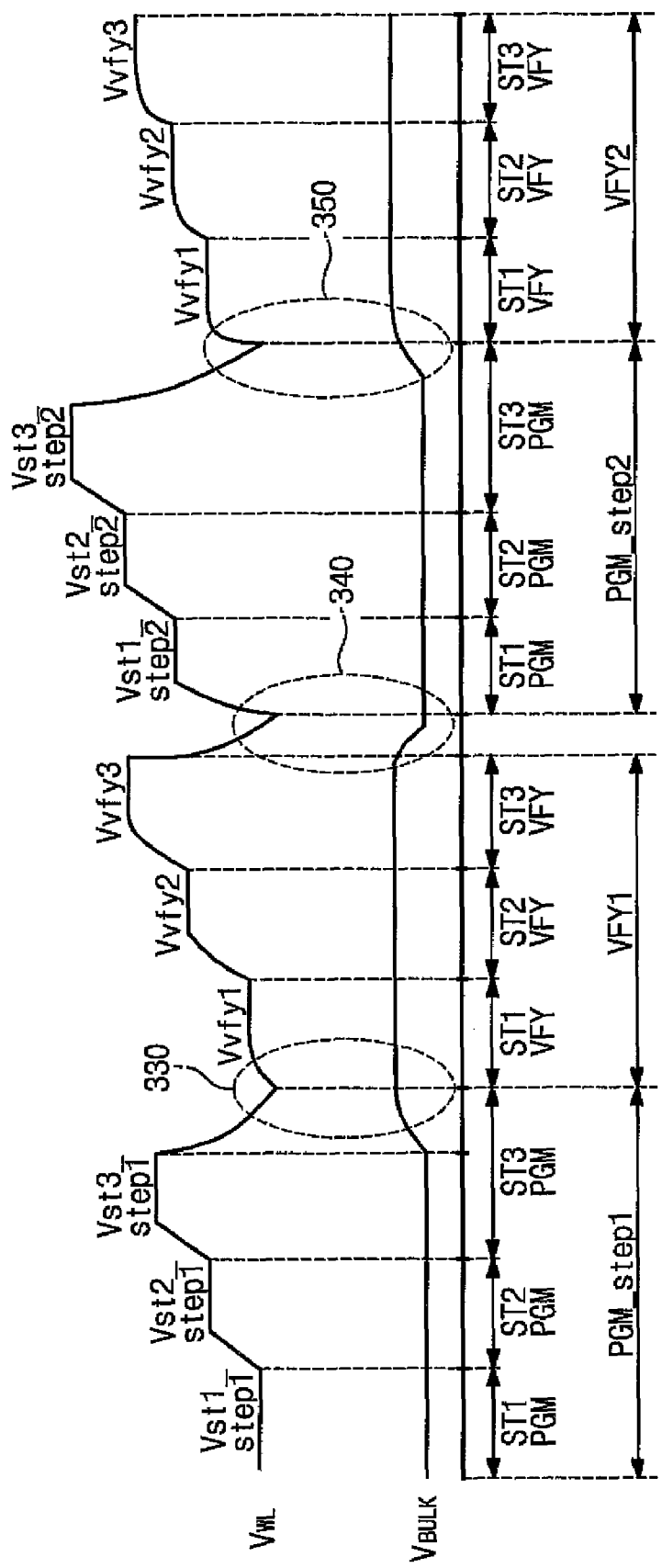
Figure 14C:
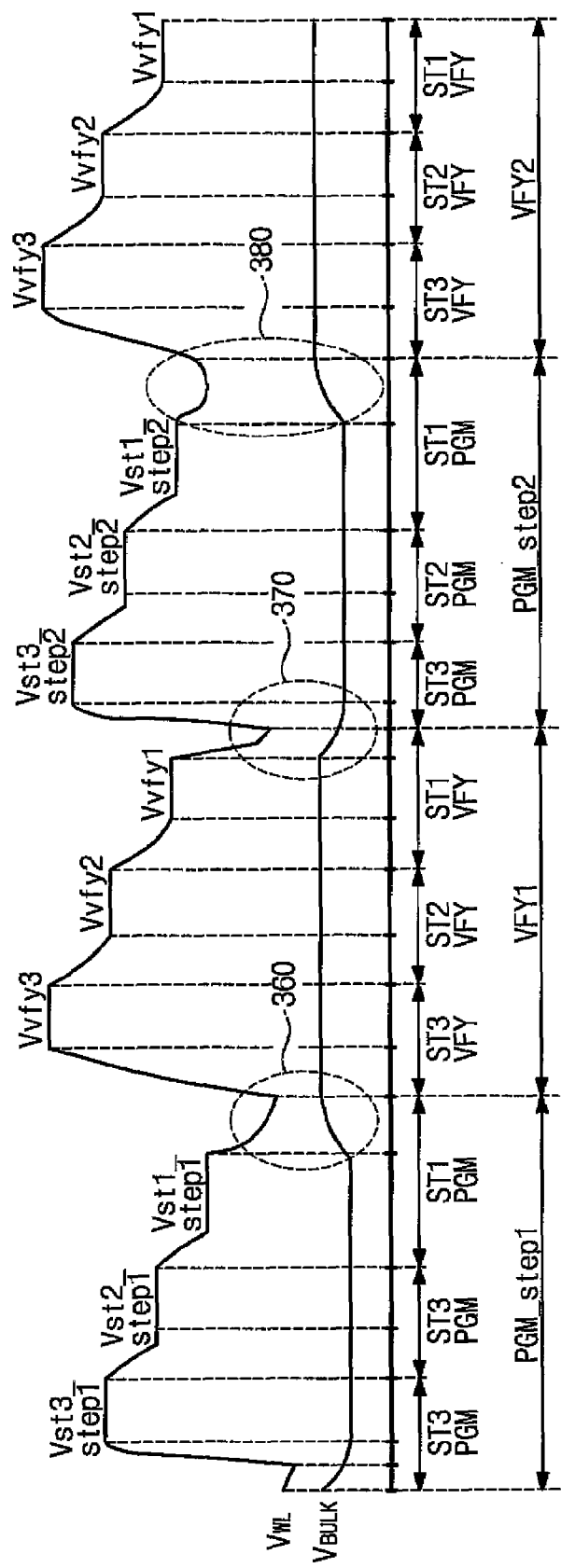

FIGS. 14A through 14C are waveform diagrams illustrating 4-bit MLC program operations corresponding to the diagrams of FIGS. 12A though 12c, respectively. Each of the waveform diagrams illustrate waveforms of voltages for programming the other group of memory cells after memory cells are programmed in a threshold voltage state ST15. That is, the waveform diagrams illustrate the fluctuation of wordline voltages Vsti_setpj and Vvfyi and a bulk voltage $V_{BULK}$ during a program operation.

FIG. 14A illustrates a wordline voltage $V_{WL}$ and a bulk voltage $V_{BULK}$ for programming memory cells belonging to a second group G2 of a 4-bit MLC described in FIG. 12A. During an initial period PGM_step1, program voltages VSti_setp1-Vst7_step1 corresponding to target threshold voltages ST1-ST6 are sequentially supplied. Charges of the wordline, to which a following program voltage is supplied, are discharged and a bulk voltage $V_{BULK}$ biased with a negative voltage are recovered to an initial value (e.g., 0V). At this point, the fluctuation of a wordline voltage and a bias voltage in a bulk area is shown in the portion designated by a reference numeral 310. During a verify period VFY1, verify voltages Vvfy1-Vvfy7 corresponding to target threshold voltages are sequentially supplied to wordlines. After supplying the verify voltage Vvfy7, a second step PGM_step2 start in which selected memory cells are programmed with an increased program voltage. Here, a setup operation of the wordline voltage and the bulk voltage $V_{BULK}$ is conducted, which is shown in the portion designated by a reference numeral 320. According to the program method of grouping the cells programmed using the method described in FIG. 12A, the setup and recovery number of a wordline voltage and a bulk voltage decrease by ½.

FIG. 14B illustrates a wordline voltage $V_{WL}$ and a bulk voltage $V_{BULK}$ for programming memory cells grouped using the method described in FIG. 12B. During an initial period PGM_step1, program voltages Vst1_step1-Vst3_step1 corresponding to three target threshold voltages ST1-ST3 are sequentially supplied to a wordline. Charges, to which a program voltage is supplied, are discharged and a bulk voltage $V_{BULK}$ biased with a negative voltage is recovered to an initial value. At this point, the fluctuation of a wordline voltage and a bias voltage in a bulk area is shown in the portion designated by a reference numeral 330. During a verify period VFY1, verify voltages Vvfy1-Vvfy3 corresponding to three target threshold voltages are sequentially supplied to the wordline. After supplying the verify voltage Vvfy3, a second step period PGM_step2 starts in which the selected memory cells are programmed with the increased program voltage. Here, a setup operation of the wordline voltage and the bulk voltage $V_{BULK}$ is conducted, which is shown in the portion designated by a reference numeral 340.

FIG. 14C illustrates another embodiment of a wordline voltage $V_{WL}$ and a bulk voltage $V_{BULK}$ for programming memory cells grouped using the method described in FIG. 12B. The waveform of FIG. 14C is the waveform of a program operation in which a program voltage and a verify voltage are applied in a different sequence to that of FIG. 14B. In FIG. 14C, program voltages Vst3_step1 and Vst3_step2 corresponding to a high threshold voltage state are first applied at program periods PGM_step1 and PGM_step2. This method is identically applied to verify periods VFY1 and VFY2.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A program method of a multi-level cell flash memory device including a plurality of memory cells, each memory cell being programmable in one of a plurality of data states corresponding one of a plurality of threshold voltage, the program method comprising:
    (a) dividing the plurality of memory cells into a plurality of groups according to target threshold voltage level;
    (b) programming memory cells belonging to a first group corresponding to a highest data target threshold voltage level among the plurality of groups; and
    (c) programming memory cells belonging to a second group corresponding to target threshold voltage levels which are lower than the target threshold voltage level corresponding to the first group,
    wherein the memory cells belonging to the second group include memory cells programmed in at least two target threshold voltage states and successively receive a plurality of program voltages corresponding to the at least two target threshold voltage states.

2. The program method as set forth in claim 1, wherein the memory cells belonging to the second group successively receive a plurality of verity voltages corresponding to the at least teo target threshold voltage states.

3. The program method as set forth in claim 1, wherein the (c) comprises:
- (d) successively supplying the plurality of program voltages corresponding to the at least two target threshold voltage states to wordlines of the memory cells belonging to the second group;
- (e) successively supplying a plurality of verify voltages corresponding to the at least two target threshold voltage states to the wordlines of the memory cells belonging to the second group; and
- (f) judging whether the programming of the memory cells belonging to the second group is pass or fail.

4. The program method as set forth in claim 3, wherein the at least two threshold voltage states are threshold voltage states corresponding to data denoting binary value '10' and data denoting binary value '01'.

5. The program method as set forth in claim 4, wherein at the (d), a program voltage corresponding to the data denoting binary value '10' is first supplied among the plurality of program voltages.

6. The program method as set forth in claim 5, wherein at the (e), a verify voltage corresponding to the data denoting the binary value '10' is first supplied among the plurality of verify voltages.

7. The program method as set forth in claim 4, wherein at the (d), a program voltage corresponding to the data denoting binary value '01' is first supplied among the plurality of program voltages.

8. The program method as set forth in claim 7, wherein at the (e), a verify voltage corresponding to the data denoting binary value '01' is first supplied among the plurality of verify voltages.

9. The program method as set forth in claim 3, further comprising:
recovering a bulk voltage of the flash memory device to an initial value when the (d) is completed.

10. The program method as set forth in claim 1, wherein the multi-level cell flash memory device is configured to store at least 3-bit data in one memory cell.

11. The program method as set forth in claim 10, further comprising after the (c):
- (d) programming memory cells belonging to a third group corresponding to at least two states of different threshold voltages which are higher than the plurality of target threshold voltages corresponding to the second group.

12. The program method as set forth in claim 11, wherein the (d) comprises:
- (e) successively supplying a plurality of program voltages corresponding to the at least two different threshold voltage states to wordlines of the memory cells belonging to the third group;
- (f) successively supplying a plurality of verify voltages corresponding to the at least two different target threshold voltage states to wordlines of the memory cells belonging to the third group; and
- (g) judging whether the program of the memory cells belonging to the third group is pass or fail.

13. The program method as set forth in claim 12, wherein at the (d), a lowest voltage is first supplied among a plurality of program voltages corresponding to the at least two target threshold voltage states and the plurality of verify voltages.

14. The program method as set forth in claim 13, wherein at the (d), a lowest voltage is first supplied among a plurality of program voltages corresponding to the at least two different threshold voltage states and the plurality of verify voltages.

15. The program method as set forth in claim 12, wherein at the (c), a highest voltage is first supplied among a plurality of program voltages corresponding to the at least two target threshold voltage states and the plurality of verify voltages.

16. The program method as set forth in claim 15, wherein at the (d), a highest voltage is first supplied among a plurality of program voltages corresponding to the at least two different target threshold voltage states and the plurality of verify voltages.

17. The program method as set forth in claim 12, further comprising:
recovering a bulk voltage of the flash memory device to an initial value when the (e) is completed.

18. A program method of a multi-level flash memory device including a plurality of memory cells, each memory cell being programmable in one of a plurality of data states corresponding one of a plurality of threshold voltage, the program method comprising:
- (a) dividing the plurality of memory cells into a highest group and remaining groups according to a target threshold voltage level;
- (b) programming memory cells belonging to the highest group; and
- (c) programming memory cells belonging to the remaining groups,
wherein at the (c), each of the remaining groups includes memory cells programmed in at least two target threshold voltage states and successively receive a plurality of program voltages corresponding to the least two target threshold voltage states.

19. The program method as set forth in claim 18, wherein at the (c), each of the remaining groups successively receives a plurality of verify voltages corresponding to the at least two target threshold voltage states.

20. The program method as set forth in claim 19, wherein the (c) comprises:
- (d) successively supplying the plurality of program voltages corresponding to the at least two target threshold voltage state to wordlines of memory cells belonging to one of the remaining groups;
- (e) successively supplying a plurality of verify voltage corresponding to the least two target threshold voltage states to wordlines of memory cells belonging to one of the groups; and
- (f) judging whether the program of the memory cells belonging to one of the groups is pass or fail.

21. The program method as set forth in claim 20, wherein the (d) further comprising:
recovering a bulk voltage of the multi-level flash memory device to an initial value after supplying the plurality of program voltages.

22. The program method as set forth in claim 21, wherein a lowest program voltage is first supplied among the plurality of program voltages.

23. The program method as set forth in claim 22, wherein a lowest verify voltage is first supplied among the plurality of verify voltages.

24. The program method as set forth in claim 23, wherein a highest verify voltage is first supplied among the plurality of verify voltages.

25. The program method as set forth in claim 24, wherein a highest program voltage is first supplied among the plurality of program voltages.

26. The program method as set forth in claim 25, wherein a lowest verify voltage is first supplied among the plurality of verify voltages.

27. The program method as set forth in claim 26, wherein a highest verify voltage is first supplied among the plurality of verify voltages.

28. The program method as set forth in claim 19, wherein the highest group includes memory cells in which the target threshold voltage corresponds to a highest state among the plurality of data states.

29. The program method as set forth in claim 19, wherein at the (c), memory cells of a group corresponding to a relatively low target threshold voltage among the other groups are first programmed.

30. The program method as set forth in claim 19, wherein at the (c), memory cells of a group corresponding to a relatively high target threshold voltage among the other groups are first programmed.

* * * * *